United States Patent [19]

Okamoto

[11] Patent Number: 5,289,058
[45] Date of Patent: Feb. 22, 1994

[54] MOS OPERATIONAL AMPLIFIER CIRCUIT
[75] Inventor: Seiji Okamoto, Tokyo, Japan
[73] Assignee: Oki Electric Industry Co., Ltd., Tokyo, Japan
[21] Appl. No.: 980,771
[22] Filed: Nov. 24, 1992
[30] Foreign Application Priority Data
 Nov. 28, 1991 [JP] Japan ................................ 3-314932
[51] Int. Cl.⁵ .......................... G06G 7/12; H03K 5/22
[52] U.S. Cl. ..................... 307/490; 307/491;
 307/262; 307/494; 307/355; 328/167; 330/253;
 330/255; 330/306
[58] Field of Search ............................... 307/262–263,
 307/490.1, 494, 355; 328/167; 330/253, 255, 306

[56] References Cited
U.S. PATENT DOCUMENTS

| | | | |
|---|---|---|---|
| 4,335,355 | 2/1981 | Haque | 330/253 |
| 4,480,230 | 7/1983 | Brehmer et al. | 330/255 |
| 5,177,450 | 1/1993 | Lee et al. | 330/255 |

FOREIGN PATENT DOCUMENTS
0256729  2/1988  European Pat. Off. .

OTHER PUBLICATIONS
Op't Eynde, F., "A CMOS Large-Swing Low-Distortion Three-Stage Class AB Power Amplifier," *IEEE Journal of Solid-State Circuits*, 25 (1990) Feb., No., 1, pp. 265–273, New York, U.S.
"MOS Operational Amplifier Design—A Tutorial Overview," by Paul R. Gray, IEEE Jouranl of Solid State Circuits, vol. SC-17, No. 6, Dec. 1982, pp. 969–982.

*Primary Examiner*—Margaret R. Wambach
*Attorney, Agent, or Firm*—Edward D. Manzo; Mark J. Murphy

[57] ABSTRACT

An operational amplifier circuit is composed of a differential amplifier circuit for delivering a signal which is obtained by amplifying a difference between voltage levels of two signals; a level shift circuit for shifting and delivering the voltage level of the signal delivered from the differential amplifier circuit; a first amplifier circuit for amplifying and delivering the signal from the level shift circuit; and a second amplifier circuit for amplifying and delivering the voltage level of the signal delivered from the differential amplifier circuit, and a CMOS output circuit whose conductive state is controlled in accordance with voltage levels of the signals delivered from the first and second amplifier circuits.

23 Claims, 2 Drawing Sheets

MOS OPERATIONAL AMPLIFIER CIRCUIT

BACKGROUND OF THE INVENTION

1) Field of the Invention

The present invention relates to an operational amplifier circuit, and in particular to an operational amplifier circuit suitably used for a MOS integrated circuit.

2) Description of the Related Art

MOS operational amplifiers have been widely used for adding and subtracting analog signals and so forth. For example, a prior art reference "MOS Operational Amplifier Design A Tutorial Overview", IEEE Journal of Solid-State Circuits, VOL. SC-17, No. 6, December 1982, Pages 969 to 981, discloses a conventional MOS operational amplifier circuit. A typical MOS operational amplifier circuit is composed of a differential amplifier circuit, a level shift circuit and an output circuit.

This operational amplifier circuit serves as an AB operational amplifier which applies a large current to a load connected to its output when a signal is received, but decreases a current running through the output stage when no signal is received.

However, the conventional MOS operational amplifier circuit sometimes outputs an output signal having distortion. Namely, the NMOS FET of the output circuit is completely turned on and is completely turned off responding to the internal signal generated by the level shift circuit. The distortion is created in the output signal when either NMOS FET or PMOS FET is completely turned off.

Further, the conventional MOS operational amplifier circuit sometimes applies a large current to a small output load resistor so as to generate an output signal at a power source voltage level. Accordingly, it raises a problem in that large scale integration with a high density is difficult since the ratio W/L (where W is gate width and L is gate length) of the MOS FETs which constitute the output stage should be large.

SUMMARY OF THE INVENTION

An object of the present invention is to provide an operational amplifier circuit which can deliver an output waveform having less distortion.

Another object of the present invention is to provide an operational amplifier circuit which is suitable for an integrated circuit.

Another object of the present invention is to provide an operational amplifier circuit which has less current consumption.

In order to attain the above-mentioned objectives the present invention provides an operational amplifier circuit comprising: a differential amplifier circuit for outputting a signal which is obtained by amplifying a difference in voltage level between two input signals; a level shift circuit for shifting and outputting a voltage level of the signal delivered from the differential amplifier circuit; a first amplifier circuit for amplifying and outputting the signal received from the level shift circuit; a second amplifier circuit for amplifying a voltage level of the signal received from the differential amplifier circuit; and a CMOS output circuit whose state is controlled in accordance with voltage levels of the signals received from the first and second amplifier circuits.

DETAILED DESCRIPTION OF THE PREFERRED EMBODIMENT

Figure 1:
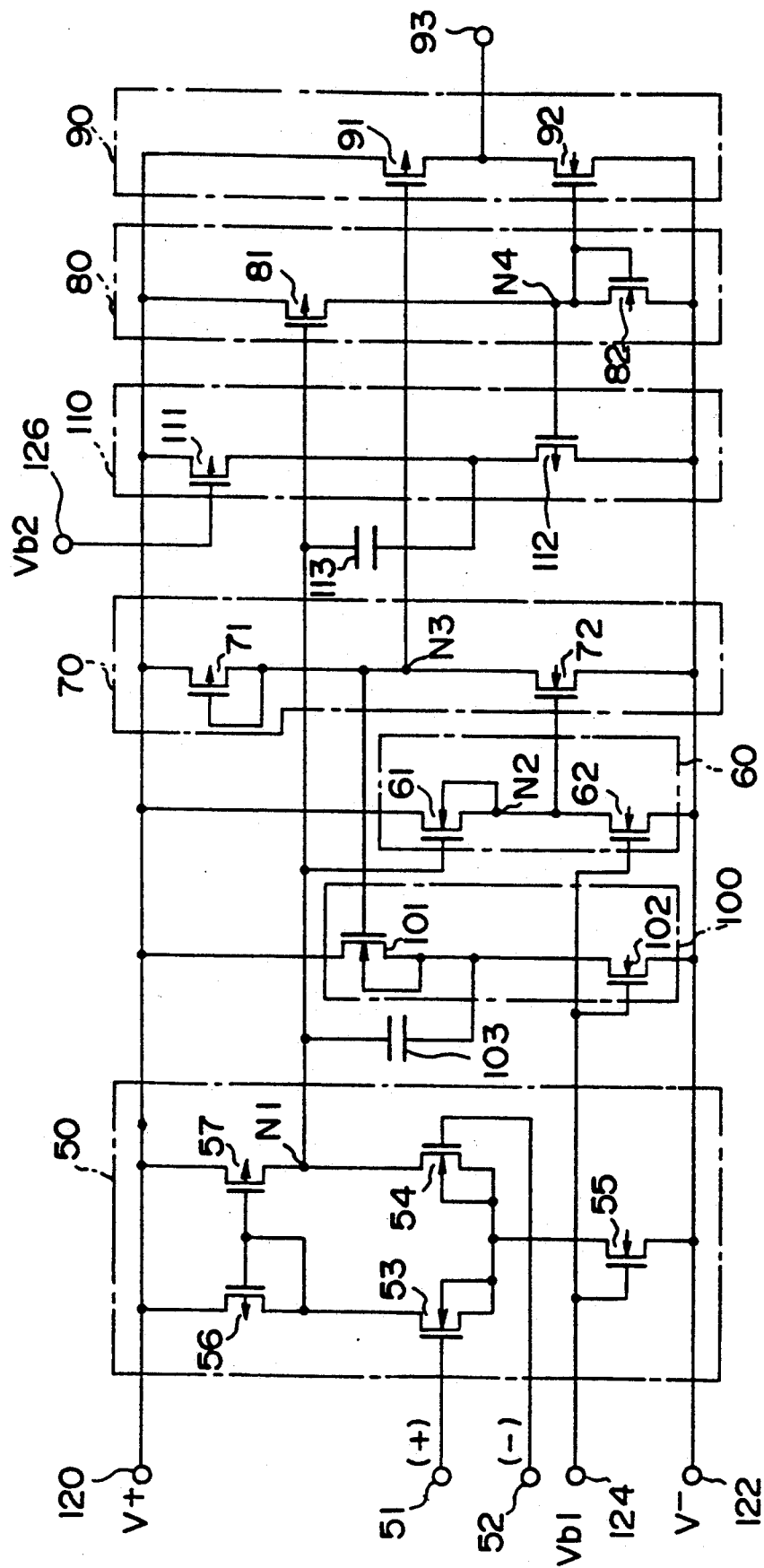
FIG. 1 is a circuit diagram illustrating an embodiment of an operational amplifier circuit according to the present invention.

Referring to FIG. 1 which is a circuit diagram illustrating an embodiment of an operational amplifier circuit according to the present invention, the operational amplifier circuit is preferably composed of complementary metal oxide semiconductor (CMOS) devices. This operational amplifier circuit comprises a differential amplifier circuit 50 for amplifying an input voltage applied to a first differential input terminal 51 in accordance with a voltage difference between the first differential input terminal 51 and a second differential input terminal 52, and then applying the thus amplified voltage to a node N1; a level shift circuit 60 for shifting the level of the voltage applied to the node N1 and then applying the thus shifted voltage to a node N2; a first amplifier circuit 70 for amplifying the voltage applied to the node N2 and then applying the amplified voltage to a node N3, a second amplifier circuit 80 for amplifying the voltage applied to the node N1 and then applying the amplified voltage to a node N4; an output circuit 90 connected to an output terminal, for applying an output voltage to the output terminal in accordance with the voltages applied to the nodes N3, N4, and a first and a second phase compensation circuit for preventing oscillation.

The first phase compensation circuit is composed of a first source follower circuit 100 and a capacitor 103, and controls the voltage at the node N1 in accordance with the voltage at the node N3 (through feed-back operation). The first source follower circuit 100 is connected between the node N1 and node N3 through the capacitor 103 and comprises an NMOS transistor 101 and an NMOS transistor 102.

The NMOS transistor 101 has a gate connected to the node N3, a drain connected to a positive power source terminal 120, and a source connected to a drain of the NMOS transistor 102. Further, the substrate of the NMOS transistor 101 is connected to the drain of the NMOS transistor 102. The NMOS transistor 102 has a gate connected to a bias terminal 124, a source connected to a negative power source terminal 122, and the drain connected to the source of the NMOS 101.

Further, the capacitor 103 is connected to the node N1 and the source of the NMOS transistor 101.

The second phase compensation circuit comprises a second source follower circuit 110 and a capacitor 113, and controls the voltage at the node N1 in accordance with the voltage at the node N4.

The second source follower circuit 110 is connected between the nodes N1, N4 through capacitor 113, and comprises PMOS transistors 111 and 112.

The PMOS transistor 111 has a gate connected to a bias terminal 126 applied with a bias voltage Vb2, a source connected to the positive power source terminal 120, and a drain connected to a source of the PMOS transistor 112. The PMOS transistor 112 has a gate connected to the node N4, a drain connected to the negative power source terminal 122, and the source connected to the drain of the PMOS transistor 111.

Further, the capacitor 113 is connected to the node N1 and the source of the PMOS transistor 112.

The differential amplifier circuit 50 is connected between the positive power source terminal 120 applied with a positive source power (+V) and the negative power source terminal 122 applied with a negative source power (−V), and comprises input NMOS transistors 53, 54, an NMOS transistor 55 constituting a low current source, PMOS transistors 56, 57 constituting a load. The NMOS transistor 53 has a gate connected to the first differential input terminal 51, a drain connected to a drain of the PMOS transistor 56, and a source connected to a drain of the NMOS transistor 55. The NMOS transistor 54 has a gate connected to the second differential input terminal 52, a drain connected to a drain of the PMOS transistor 57 and a source connected to a drain of the NMOS transistor 55. The NMOS transistor 55 has a gate connected to the bias terminal 124 applied with a bias voltage Vb1, the drain connected commonly to the sources of the NMOS transistor 53 and the NMOS transistor 54, and a source connected to the negative power source terminal 122. The PMOS transistors 56, 57 have sources commonly connected to the positive power source terminal 120 and gates commonly connected to the drain of the NMOS transistor 53.

The level shift circuit 60 is connected to the differential amplifier circuit 50, and comprises NMOS transistors 61, 62. The NMOS transistor 61 has a gate connected to the node N1, a drain connected to the positive power source terminal 120, and a source connected to the node N2. Further, the substrate of the NMOS transistor 61 is connected to the node N2. The NMOS transistor 62 has a gate connected to the bias terminal 124, a source connected to the negative power source terminal 122, and a drain connected to the node N2.

The first amplifier circuit 70 is connected to the level shift circuit 60, and comprises PMOS transistors 71 and an NMOS transistor 72. The PMOS 71 has a source connected to the positive power source terminal 120, and a drain and a gate connected to the node N3. Further, the PMOS transistor 71 serves as a load. The NMOS transistor 72 has a source connected to the node N2, a gate connected to the negative power source terminal 122, and a drain connected to the node N3.

The second amplifier circuit 80 is connected to the differential amplifier circuit 50, and comprises a PMOS transistor 81 and an NMOS transistor 82. The PMOS transistor 81 has a source connected to the positive power source terminal 120, a gate connected to the node N1 and a drain connected to the node N4. The NMOS transistor 82 has a gate and a drain connected to the node N4, and a source connected to the negative power source terminal 122. The NMOS transistor 82 serves as a load.

The output circuit 90 has a PMOS transistor 91 and an NMOS transistor 92. The PMOS transistor 91 has a gate connected to the node N3, a source connected to the positive power source terminal 120, and a drain connected to the output terminal 93. The NMOS transistor 92 has a gate connected to the node N4, a source connected to the negative power source terminal 122, and a drain connected to the output terminal 93.

It is noted that the PMOS transistor 91 has a threshold voltage which is equal to that of the PMOS transistor 71. Further, the NMOS transistor 82 has a threshold voltage which is equal to that of the NMOS transistor 92.

The operation of the operational amplifier circuit shown in FIG. 1 is as follows.

(a) Operation of Current Supply to Load connected to Output

Figure 2:
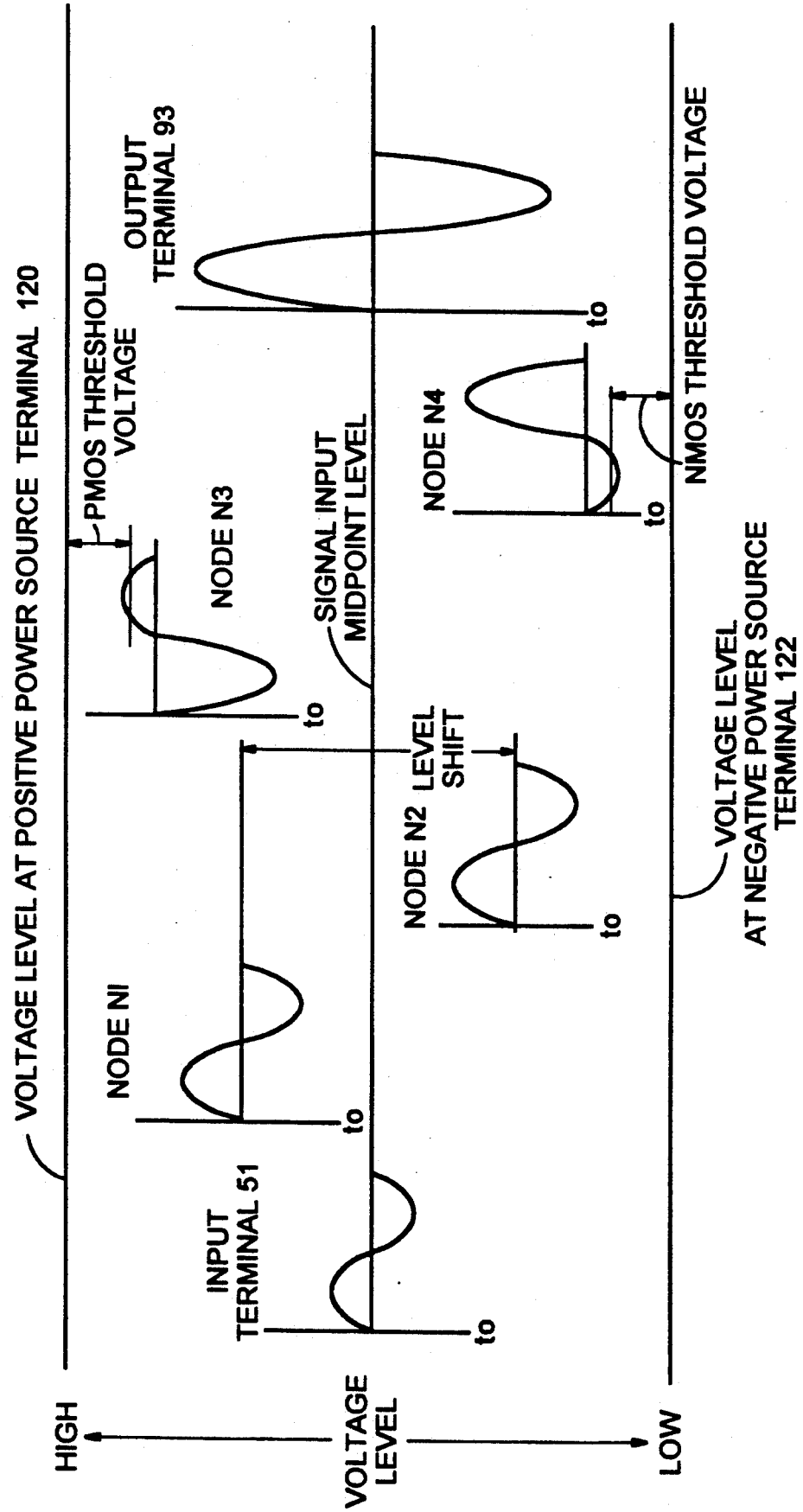
FIG. 2 is a view illustrating signal waveforms at nodes in the operational amplifier circuit according to the present invention.

Terminal:

FIG. 2 is a view illustrating the relationship between signal waveforms at the nodes in the FIG. 1 circuit, and the voltage potential levels. The ordinate exhibits voltage level and the abscissa exhibits signal waveforms at the nodes.

The waveform configuration at each node is shown with a time t0 as a reference. It is estimated that the level of a signal applied to the second differential input terminal 52 is at a signal input midpoint.

An input signal having a positive voltage level with respect to the second differential input terminal 52 (signal input midpoint potential level) is applied to the first differential input terminal 51. This input signal is amplified and applied to the node N1 by the differential amplifier circuit 50 with the same polarity as that of the input signal.

The input signal applied to the node N1 is shifted in the positive direction by a degree corresponding to a variation in voltage at the node N1, and is applied to the node N2 by the level shift circuit 60. It is noted that the level shift circuit 60 has a voltage gain of 1, and accordingly, the signal applied to the node N1 is not amplified thereby.

The signal at node N2, is amplified by the first amplifier circuit 70 and inverted phase by a degree corresponding to a variation in voltage at the node N2, and is then applied to the gate of the PMOS transistor 91 through node N3. Then, the gate-source voltage of the PMOS transistor 91 becomes higher so that the PMOS transistor 91 is active. Accordingly, a current from the power source is fed to the load connected to the output terminal 93.

Further, upon activation of the PMOS transistor 91, the voltage at the node N3 is impedance-converted by the first source follower circuit 100, and is then fed back to the node N1 through capacitor 103. Accordingly, it is possible to effectively prevent the operational amplifier circuit from oscillating.

Meanwhile, the input signal applied to the node N1 is amplified and inverted by a degree corresponding to a variation in voltage produced at the node N1, and is applied to the gate of the NMOS transistor 92 through node N4 by the second amplifier circuit 80. Then, the gate-source voltage of the NMOS transistor 92 becomes lower so that the current at the drain of the NMOS transistor 92 decreases. However, since the NMOS transistor 82 is provided, the voltage at the node N4 is maintained at the threshold voltage inherent to the NMOS transistor 82. Accordingly, the NMOS transistor 92 having a threshold voltage equal to that of the NMOS transistor 82 is just barely turned off.

(b) Operation of Absorption of Current from Load connected to

Output Terminal:

An input signal having a negative voltage level with respect to the second differential input terminal 52 is applied to the first differential input terminal 51 by the differential amplifier circuit 50. This input signal is amplified and is applied to the node N1 with the same polarity as that of the input differential.

The input signal applied to the node N1 is amplified and inverted by the second amplifier circuit 80 by a degree corresponding to a variation in voltage produced at the node N1, and is then applied to the gate of the NMOS transistor 92 through node N4. Accordingly, the NMOS transistor 92 is active. Thus, it is possible to absorb a current from the load connected to the output terminal 93.

Further, since the voltage at the node N3 increases, the PMOS transistor 91 is turned off. However, since the PMOS transistor 71 is provided, the voltage at the node N3 is maintained at the threshold voltage inherent to the PMOS transistor 71. Accordingly, the PMOS transistor 91 having a threshold voltage equal to that of the PMOS transistor 71, is just barely turned off.

Further, upon activation of the NMOS transistor 91, the voltage at the node N4 is impedance-converted by the second source follower circuit 110, and is then fed back to the node N1 through capacitor 113. Accordingly, it is possible to prevent the operational amplifier circuit from oscillating.

According to the present invention, the voltage level applied to the output terminal 93 makes a smooth transition from a positive voltage level to a negative direction or from a negative voltage level to a positive direction since the gate voltages with which a PMOS transistor 91 and the NMOS transistor 92 constituting the output circuit 90 are minimally maintained at their threshold levels, just barely turning off. Thus distortion (crossover distortion) in the waveform produced at the output terminal 93 can be reduced.

Further, according to the present invention, a large current can be applied to the load connected to the output terminal 93 even though the W/L ratio of the MOS transistor constituting the output circuit is increased. Accordingly, the operation amplifier circuit can have a large degree of integration. Further, it is possible to reduce current consumption at the time when no signal is inputted.

What is claimed is:

1. An operational amplifier circuit composed of MOS FETs comprising:
   a first power source terminal having a first power voltage level;
   a second power source terminal having a second power voltage level;
   a differential amplifier circuit, connected to said first and second power source terminals and having first and second input terminals and a first node, for outputting a first signal having a voltage level proportional to the difference between a voltage level of a first differential input signal applied to said first input terminal and a voltage level of a second differential input signal applied to said second input terminal;
   a level shift circuit, connected to said first and second power source terminals, said first node and a second node, for outputting a second signal which is obtained by shifting the voltage level of said first signal;
   a first amplifier circuit, connected to said first and second power source terminals, said second node and a third node, for outputting a third signal which is obtained by amplifying said second signal;
   a second amplifier circuit, connected to said first and second power source terminals, said first node and a fourth node, for outputting a fourth signal which is obtained by amplifying said first signal; and
   an output circuit, connected to said first and second power source terminals, said third and fourth nodes and an output terminal, for outputting an output signal, said output circuit having first and second conductive MOS transistors which are connected between said first and second power source terminals and are in series with said output terminal which is interposed between said first and second conductive MOS transistors, wherein said first conductive MOS transistor can vary from being completely turned on to just barely being turned off in response to said third signal, and said second conductive MOS transistor can vary from being completely turned on to just barely being turned off in response to said fourth signal.

2. An operational amplifier circuit as set forth in claim 1, wherein said first conductive MOS transistor is a PMOS transistor, and said second conductive MOS transistor is an NMOS transistor.

3. An operational amplifier circuit as set forth in claim 1, wherein said level shift circuit comprises a first NMOS transistor having a drain connected to said first power source terminal, a gate connected said first node and a source connected to said second node, and a second NMOS transistor having a source connected to said second power source terminal, a gate connected to a bias terminal to which a bias voltage is applied, and a drain connected to said second node.

4. An operational amplifier circuit as set forth in claim 1, wherein said first amplifier circuit comprises a first PMOS transistor having a source connected to said first power source terminal, a gate and a drain connected commonly to said third node, and a third NMOS transistor having a source connected to said second power source terminal, a gate connected to said second node and a drain connected to said third node.

5. An operational amplifier circuit as set forth in claim 1, wherein said second amplifier circuit comprises a second PMOS transistor having a source connected to said first power source terminal, a drain connected to said fourth node and a gate connected to said first node, and a fourth NMOS transistor having a source connected to said second power source terminal, and a gate and a drain connected commonly to said fourth node.

6. An operational amplifier circuit as set forth in claim 4, wherein said first PMOS transistor has a threshold voltage which is equal to a threshold voltage of said first conductive MOS transistor in said output circuit.

7. An operational amplifier circuit as set forth in claim 5, wherein said fourth NMOS transistor has a threshold voltage which is equal to a threshold voltage of said second conductive MOS transistor in said output circuit.

8. An operational amplifier circuit as set forth in claim 4, wherein said third signal has a voltage level which is minimally maintained near the threshold voltage level of said first PMOS transistor.

9. An operational amplifier circuit as set forth in claim 5, wherein said fourth signal has a voltage level which is minimally maintained near the threshold voltage of said fourth NMOS transistor.

10. An operational amplifier circuit as set forth in claim 1, wherein said operational amplifier circuit further comprises:
   a first feed-back circuit connected between said third node and said first node, for feeding back the voltage level of said third signal to said first node; and a second feed-back circuit connected between said fourth node and said first node, for feeding back the voltage level of said fourth signal to said first node.

11. An operational amplifier circuit composed of MOS FETs comprising:
   a differential amplifier circuit having first and second input terminals and a first node, for outputting a first signal having a voltage level proportional to a difference between a voltage level of a first differential signal applied to said first input terminal and a voltage level of a second differential signal applied to said second input terminal;
   a first amplifying circuit for amplifying said first signal and simultaneously shifting the voltage level of said first signal;
   a second amplifying circuit for amplifying said first signal;
   a first conductive MOS transistor whose conductive state is controlled by said first signal amplified by said first amplifying circuit;
   a second conductive MOS transistor whose conductive state is controlled by said first signal amplified by said second amplifying circuit; and
   an output terminal connected between said first conductive MOS transistor and said second conductive MOS transistor.

12. An operational amplifier circuit as set forth in claim 11, wherein said first conductive MOS transistor is a PMOS transistor, and said second conductive MOS transistor is an NMOS transistor.

13. An operational amplifier circuit as set forth in claim 11, wherein said first signal amplified by said first amplifying circuit turns on said first conductive MOS transistor, and said first signal amplified by said second amplifying circuit turns on said second conductive MOS transistor.

14. An operational amplifier circuit composed of MOS FETs comprising:
   a first power source terminal having a first power voltage level;
   a second power source terminal having a second power voltage level;
   first, second, third and fourth nodes;
   first and second input terminals;
   an output terminal;
   a differential amplifier circuit, connected to said first and second power source terminals, said first and second input terminals and said first node, for outputting a first signal having a voltage level proportional to the difference between voltage levels applied to said first and second input terminals;
   a level shift circuit connected to said first and second power source terminals and said first node and said second node, for outputting a second signal which is obtained by shifting the voltage level of the first signal;
   a first amplifier circuit connected to said first and second power source terminals, said second and third nodes and a first MOS FET of a first conductivity type having a source connected to said first power source terminal, a gate and a drain commonly connected to said third node for amplifying the second signal and outputting a third signal to said third node corresponding to the amplified second signal;
   a second amplifier circuit coupled to said first and second power source terminals, said first and fourth nodes and a second MOS FET of a second conductivity type having a source connected to said second power source terminal, a gate and a drain commonly connected to said fourth node for amplifying the first signal and outputting a fourth signal to said fourth node corresponding to the amplified first signal; and
   an output circuit coupled to said first and second power source terminals, said third and fourth nodes, said output terminal, a third MOS FET of the first conductivity type having a source connected to said first power supply terminal, a gate connected to said third node and a drain connected to said output terminal and a fourth MOS FET of the second conductivity type having a source connected to said second power source terminal, a gate connected to said fourth node and a drain connected to said output terminal for outputting a fifth signal to said output terminal in response to the third and fourth signal.

15. An operational amplifier circuit as set forth in claim 14, wherein said first and fourth MOS FETs are NMOS transistors.

16. An operational amplifier circuit as set forth in claim 14, wherein said level shift circuit comprises a fifth n-type MOS FET having a drain connected to said first power source terminal, a gate connected to said first node and a source connected to said second node and a sixth n-type MOS FET having a drain connected to said second node, source connected to said second power source terminal and gate connected to a bias terminal applied to predetermined voltage.

17. An operational amplifier circuit as set forth in claim 14, wherein said first amplifier circuit further comprises a seventh n-type MOS FET having a drain connected to said third node, a source connected to said second power source terminal and a gate connected to said second node.

18. An operational amplifier circuit as set forth in claim 14, wherein said second amplifier circuit further comprises a eighth p-type MOS FET having a drain connected to said fourth node, a source connected to said first power source terminal and a gate connected to said first second node.

19. An operational amplifier circuit as set forth in claim 14, wherein said first MOS FET has a threshold voltage level which is equal to a threshold voltage level of the third MOS FET.

20. An operational amplifier circuit as set forth in claim 14, wherein said second MOS FET has a threshold voltage level which is equal to a threshold voltage level of the fourth MOS FET.

21. An operational amplifier circuit as set forth in claim 14, wherein the third signal has a voltage level ranging from the second voltage level to the threshold voltage level of the first MOS FET.

22. An operational amplifier circuit as set forth in claim 14, wherein the fourth signal has a voltage level ranging from the first voltage level to the threshold voltage level of the second MOS FET.

23. An operational amplifier circuit as set forth in claim 14, wherein said operational amplifier circuit further comprises:
   a first feed-back circuit connected between said first node and said third node for feeding back the voltage level of said third node to said first node; and
   a second feed-back circuit connected between said first node and said fourth node for feeding back the voltage level of said fourth node to said first node.

* * * * *